United States Patent
Wu et al.

(10) Patent No.: US 9,972,549 B2
(45) Date of Patent: May 15, 2018

(54) DISPLAY DEVICE

(71) Applicant: AU Optronics Corporation, Hsin-Chu (TW)

(72) Inventors: Tsung-Tien Wu, Hsin-Chu (TW); Wen-Wei Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days. days.

(21) Appl. No.: 15/675,853

(22) Filed: Aug. 14, 2017

(65) Prior Publication Data

US 2018/0108679 A1    Apr. 19, 2018

(30) Foreign Application Priority Data

Oct. 14, 2016 (TW) .............................. 105133356 A

(51) Int. Cl.
*H01L 27/32* (2006.01)
*H01L 21/66* (2006.01)
(Continued)

(52) U.S. Cl.
CPC .............. *H01L 22/30* (2013.01); *H01L 22/20* (2013.01); *H01L 22/22* (2013.01); *H01L 27/124* (2013.01);
(Continued)

(58) Field of Classification Search
CPC ..... H01L 27/124; H01L 22/22; H01L 27/156; H01L 27/3276; H01L 2251/568; H01L 22/30; G02F 2001/136254; G02F 2203/69
See application file for complete search history.

(56) References Cited

U.S. PATENT DOCUMENTS

2007/0291212 A1* 12/2007 Asada ............... G02F 1/133512
349/139
2014/0217429 A1  8/2014 Lin et al.
2016/0189593 A1  6/2016 Lee et al.

FOREIGN PATENT DOCUMENTS

CN    105741734 A    7/2016
CN    105870156 A    8/2016
(Continued)

*Primary Examiner* — Fei Fei Yeung Lopez
(74) *Attorney, Agent, or Firm* — WPAT, PC

(57) ABSTRACT

A display device includes a plurality of pixel repairing blocks and each pixel repairing block includes a first sub-pixel unit and a second sub-pixel unit. The first sub-pixel unit has a first power supply terminal and a second power supply terminal. The first power supply terminal of the first sub-pixel unit is electrically coupled to a first power line and the second power supply terminal of the first sub-pixel unit is electrically coupled to a second power line. The second sub-pixel unit has a first power supply terminal and a second power supply terminal. The first power supply terminal of the second sub-pixel unit is electrically coupled to the first power line and the second power supply terminal of the second sub-pixel units electrically coupled to a third power line. The second sub-pixel unit is adjacent to the first sub-pixel unit, and both the second sub-pixel unit and the first sub-pixel unit are configured to generate a first colored light. The plurality of pixel repairing blocks includes a first pixel repairing block. The second power supply terminal of the first sub-pixel unit of the first pixel repairing block is electrically coupled to the second power supply terminal of the second sub-pixel unit of the first pixel repairing block.

11 Claims, 21 Drawing Sheets

(51) Int. Cl.
    *H01L 27/12*           (2006.01)
    *H01L 27/15*           (2006.01)
    *G02F 1/1362*         (2006.01)

(52) U.S. Cl.
    CPC ........ *H01L 27/156* (2013.01); *H01L 27/3276* (2013.01); *G02F 2001/136254* (2013.01); *G02F 2203/69* (2013.01); *H01L 2251/568* (2013.01)

(56) References Cited

FOREIGN PATENT DOCUMENTS

| | | |
|---|---|---|
| KR | 10-2016-0083445 | 7/2016 |
| TW | 201432360 A | 8/2014 |

\* cited by examiner

DISPLAY DEVICE

CROSS-REFERENCE TO RELAYED APPLICATION

The instant application claims priority to Taiwan patent application NO. 105133356, filed on Oct. 14, 2016. The content of the above application is incorporated by reference in its entirety.

BACKGROUND

Technical Field

The certain embodiments of the present invention relates to the display device, and especially, to a display device having an optical compensation feature.

Related Art

With rapid development of the panel industry, the panel manufacturing technology tends to be more mature. A display panel using a light emitting diode (LED) becomes more popular. However, in a manufacturing process, an LED may be damaged due to some factors. Consequently, a probability of panel repairing is increased. To avoid this problem, an existing solution is: Install a plurality of LEDs in a panel pixel. By means of this method, although the probability of panel repairing can be reduced, costs of LEDs are increased, and available space in the panel pixel is reduced.

SUMMARY

An embodiment of the present invention discloses a display device, having a first power line group and a second power line group. The first power line group includes a first power line. The second power line group includes a second power line and a third power line. The display device includes a plurality of pixel repairing blocks, and each pixel repairing block includes a first sub-pixel unit and a second sub-pixel unit. The first sub-pixel unit has a first power supply terminal and a second power supply terminal. The first power supply terminal of the first sub-pixel unit is electrically coupled to the first power line, and the second power supply terminal of the first sub-pixel unit is electrically coupled to the second power line. The first sub-pixel unit is configured to generate a first colored light. The second sub-pixel unit has a first power supply terminal and a second power supply terminal. The first power supply terminal of the second sub-pixel unit is electrically coupled to the first power line, and the second power supply terminal of the second sub-pixel unit is electrically coupled to the third power line. The second sub-pixel unit is adjacent to the first sub-pixel unit, and the second sub-pixel unit is configured to generate the first colored light. The pixel repairing blocks include a first pixel repairing block, and the second power supply terminal of the first sub-pixel unit of the first pixel repairing block is electrically coupled to the second power supply terminal of the second sub-pixel unit of the first pixel repairing block.

Descriptions of the content disclosed above and descriptions of the following implementation manners are used to demonstrate and explain the spirit and principle of the present invention, and further explain the patent application scope of the present invention.

DETAILED DESCRIPTION

Figure 1:
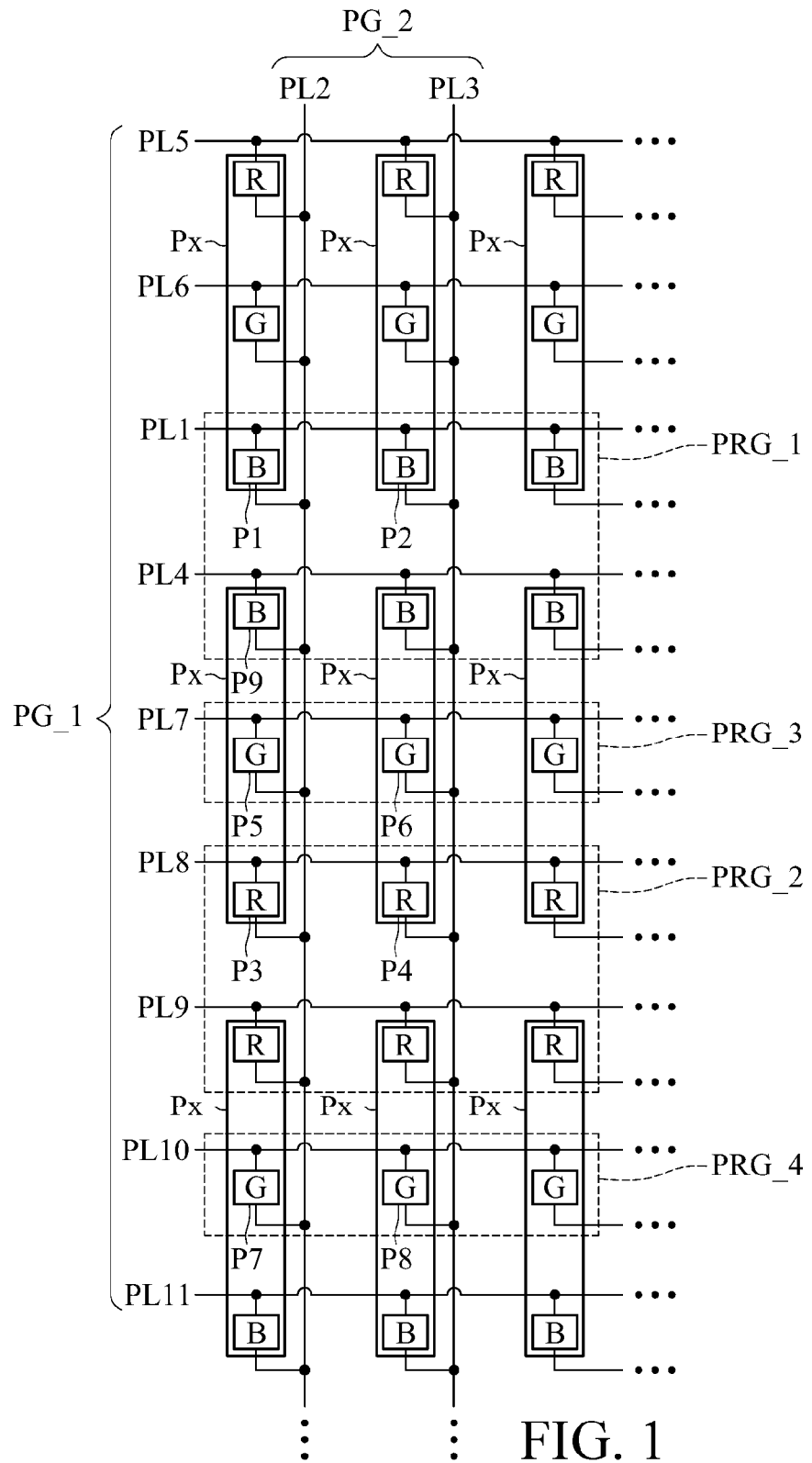
FIG. 1 is a circuit architecture diagram of a display device according to an embodiment of the present invention.

The following implementation manners describe in detail features and advantages of the present invention. The content enables any person skilled in the art to know technical content of the present invention and implement the technical content. A person skilled the art can easily understand the objectives and advantages of the present invention according to the content, the application scope, and drawings disclosed in the specification. The following embodiments further describe ideas in the present invention, but are not intended to limit the scope of the present invention.

Terms used in this disclosure usually have common meanings in the field of this disclosure, and meanings when used in a specific background. Some particular terms used to describe this disclosure will be defined and discussed in the following or discussed in other parts of this specification, to provide a description for a person skilled in the art to understand this disclosure. In addition, a same object may be described in more than one manner, and meanings thereof may be understood as one or the entire meaning of the multiple description manners. Therefore, replaceable words and synonyms may be used in this specification to represent any one or more terms. No matter whether the terms are described or discussed in detail in this specification, the used replaceable words and synonyms have no specific meaning. This disclosure provides synonyms of some terms. One or more commonly-used synonyms do not limit use of other synonyms. An example mentioned in any part of this specification and an example including any discussed term are merely used for description, rather than limiting the scope and meaning of this disclosure or any term used as an example for description. Similarly, this disclosure is not limited to any embodiment of this specification.

It may be understood that when a component is (electrically) connected to another component, the component may be directly (electrically) connected to the another component, or a component between the two components may exist, especially those component frequently used as interposed components. On the contrary, when a component is directly (electrically) connected to another component, there is no component between the two components. The interpretation of the terms is generally dependent on and not limited to the background knowledge of the technical field of the instant invention and disclosure of the instant document.

In addition, it may be understood that, in the description of signal transmission in this specification, the transmitted signal may be attenuated or distorted, but the attenuated or distorted signal still corresponds to the signal before the transmission. Generally, attenuation or distortion in the transmission process does not affect a correspondence between a signal at a signal transmitter and a signal at a signal receiver. In addition, there may be a signal buffer unit or a signal enhancement unit between the signal transmitter and the signal receiver, to compensate for the signal attenuation. However, this does not affect the correspondence between the signal at the signal transmitter and the signal at the signal receiver.

In addition, it may be understood that, when a component is above another component, the component may be directly above the another component, or a component between the two components may exist. On the contrary, when a component is directly above another component, there is no component between the two components. The term "and/or" includes any one of and all combinations of one or more listed related items.

In addition, it may be understood that although terms "first", "second", and "third" are used in this disclosure to describe various components, elements, areas, layers, and/or parts in this specification, the terms shall not limit the components, elements, areas, layers, and/or parts. The terms are merely used to distinguish a component, an element, an area, a layer, and/or a part from another component, another element, another area, another layer, and/or another part. Therefore, in the case of not deviating from the disclosure, a first component, element, area, layer, and/or part may be referred to as a second component, element, area, layer, and/or part.

The terms used this specification are merely used to describe specific embodiments, rather than limiting this disclosure. As used in this specification, unless otherwise specified, "one" and "this" in a singular form intends to include plural forms of the terms. It may be further understood that, when terms "include" or "have" are used in this specification, it is clearly stated that the feature, area, entirety, step, operation, element, and/or component exist, and existence or joining of one or more other features, areas, entireties, steps, operations, components, elements, and/or ethnic groups thereof exist or join is not excluded.

In addition, relative terms, for example, "below" or "bottom", "above" or "top", and "left" or "right" may be used in this specification to describe a relationship between a component and another component in the drawing. It may be understood that, in addition to a direction described in the drawing, the relative terms may intend to include different directions of the component. For example, that a component in the drawing rotates may be described as: A component below another component is to be located above the another component. Therefore, for example, the term "below" may include two directions "below" and "above" according to a specific direction of the drawing. Similarly, that a component in the drawing rotates is described as: A component below another component is to be above the another component. Therefore, for example, the term "below" may include two directions "above" and "below".

Terms "approximately" or "about" intends to refer to being within a range from 20% more than a given value or range to 20% less than the given value or range, and preferably within a range from 10% more than the given value or range to 10% less than the given value or range, and more preferably within a range from 5% more than the given value or range to 5% less than the given value or range. A quantity herein is approximate, and unless otherwise specified, may be represented by using terms "approximately" or "about".

For example, a verb is used in the patent application scope to limit an apparatus claim. In a specific case, a person of ordinary skill in the art may understand that a similar limitation is a limitation to descriptions of a structure rather than to a manufacturing method. For example, a first component is "welded" to a second component, the first component is "disposed" above the second component, the first component is "formed" on the second component, a conductor is "grounded", a cylinder is "twisted", a substrate is "coated" with a printing material, and a conducting through hole "exposes" a metal electrode below the through hole.

The term "expose" used in this specification does not intend to refer to: A component or a structure is exposed to external space, and may refer to: The component or the structure is not completely covered by another component above the component.

The term "surrounding" or another similar term used in this specification does not represent that an object is completely surrounded by another object.

The term "adjacent" or another similar term used in this specification does not represent that there is no component between two adjacent components.

The "system", "module", "functional unit", "operational unit", and "processing unit", or similar terms may be used to refer to a particular application specific integrated circuit (ASIC), an electronic circuit, an entirety of an electronic circuit, a combination of logical circuits, a field programmable gate array (FPGA), a processor having an instruction processing capability, or another hardware structure used to execute the foregoing component; or may refer to any combination of the foregoing listed content, or a structure including a part of or all of the foregoing listed content, for example, a system chip. A structure represented by a "system", a "module", a "functional unit", an "operational unit", and a "processing unit", or a similar term may further include a memory, configured to store an instruction or code executed by a processor.

Referring to FIG. 1, FIG. 1 is a circuit architecture diagram of a display device according to an embodiment of the present invention. As shown in FIG. 1, the display device 10 has a first power line group PG_1 and a second power line group PG_2. The first power line group PG_1 includes a first power line PL1. The second power line group PG_2 includes a second power line PL2 and a third power line PL3. In the embodiment shown in FIG. 1, the first power line group PG_1 further includes more other power lines PL4 to PL11. As shown in FIG. 1, the display device 10 has a plurality of pixels Px (formed by RGB), the display device 10 includes a first pixel repairing block PRG_1, a second pixel repairing block PRG_2, a third pixel repairing block PRG_3, and a fourth pixel repairing block PRG_4. The first pixel repairing block PRG_1 includes a first sub-pixel unit P1 and a second sub-pixel unit P2. The second pixel repairing block PRG_2 includes a third sub-pixel unit P3 and a fourth sub-pixel unit P4. The third pixel repairing block PRG_3 includes a fifth sub-pixel unit P5 and a sixth sub-pixel unit P6. The fourth pixel repairing block PRG_4 includes a seventh sub-pixel unit P7 and an eighth sub-pixel unit P8. In this embodiment, for the convenience of description, only the foregoing four pixel repairing blocks are used as an example for description. In practice, the display device 10 includes more pixel repairing blocks.

R, G, B shown in FIG. 1 respectively represent three primary colors (red, green, blue), and each R, G, B separately corresponds to one sub-pixel unit in a pixel Px. In practice, R, G, B of the sub-pixel unit may generate combinations of colors by means of combination according to respective gray scale values, so that people may receive an image of different colors visually. In the embodiment shown in FIG. 1, each sub-pixel unit has a light emitting diode (LED), so that each sub-pixel unit may generate a colored light. For example, a first colored light generated by the first sub-pixel unit P1 and the second sub-pixel unit P2 included in the first pixel repairing block PRG_1 is blue, and a second colored light generated by the third sub-pixel unit P3 and the fourth sub-pixel unit P4 included in the second pixel repairing block PRG_21 is red.

Figure 2:
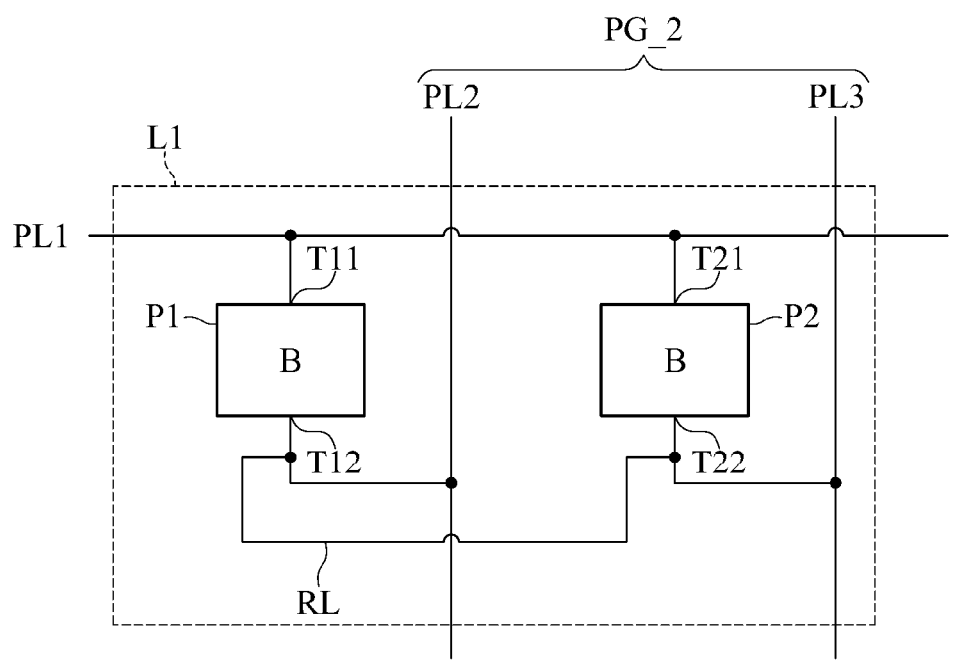
FIG. 2 is a circuit architecture diagram of a part of a first pixel repairing block according to an embodiment of the present invention.

Referring to FIG. 1 and FIG. 2, FIG. 2 is a circuit architecture diagram of a part of a first pixel repairing block according to an embodiment of the present invention. The first sub-pixel unit P1 included in the first pixel repairing block PRG_1 has a first power supply terminal T11 and a second power supply terminal T12. The first power supply terminal T11 of the first sub-pixel unit P1 is electrically coupled to the first power line PL1, and the second power supply terminal T12 of the first sub-pixel unit P1 is electrically coupled to the second power line PL2. Specifically, an anode terminal of the LED of the first sub-pixel unit P1 is electrically coupled to the first power line PL1, and a cathode terminal of the LED of the first sub-pixel unit P1 is electrically coupled to the second power line PL2. In practice, a current flows from the first power line PL1 to the anode terminal of the LED, and flows out from the cathode terminal of the LED to the second power line PL2, so that the LED emits light. The second sub-pixel unit P2 has a first power supply terminal T21 and a second power supply terminal T22. The first power supply terminal T21 of the second sub-pixel unit P2 is electrically coupled to the first power line PL1, the second power supply terminal T22 of the second sub-pixel unit P2 is electrically coupled to the third power line PL3. Specifically, an anode terminal of the LED of the second sub-pixel unit P2 is electrically coupled to the first power line PL1, and a cathode terminal of the LED of the second sub-pixel unit P2 is electrically coupled to the third power line PL3. In practice, a current flows from the first power line PL1 to the anode terminal of the LED, and flows out from the cathode terminal of the LED to the third power line PL3, so that the LED emits light. The second sub-pixel unit P2 is adjacent to the first sub-pixel unit P1. For the convenience of description, the present invention describes only the first pixel repairing block PRG_1. The second pixel repairing block PRG_2, the third pixel repairing block PRG_3, and the fourth pixel repairing block PRG_4 have same circuit structures, and details are not described herein again. In this embodiment, different from the other pixel repairing blocks, in the first pixel repairing block PRG_1, the second power supply terminal T11 of the first sub-pixel unit P1 is electrically coupled to the second power supply terminal T12 of the second sub-pixel unit P2. Specifically, as shown in FIG. 2, the first pixel repairing block PRG_1 includes a repairing line RL, separately connected to the second power supply terminal T12 of the first sub-pixel unit P1 and the second power supply terminal T22 of the second sub-pixel unit P2. In an example, the repairing line RL is generated by means of laser welding. However, in another embodiment, the repairing line may be generated in another physical manner. The present invention is not limited to the foregoing example.

Figure 3:
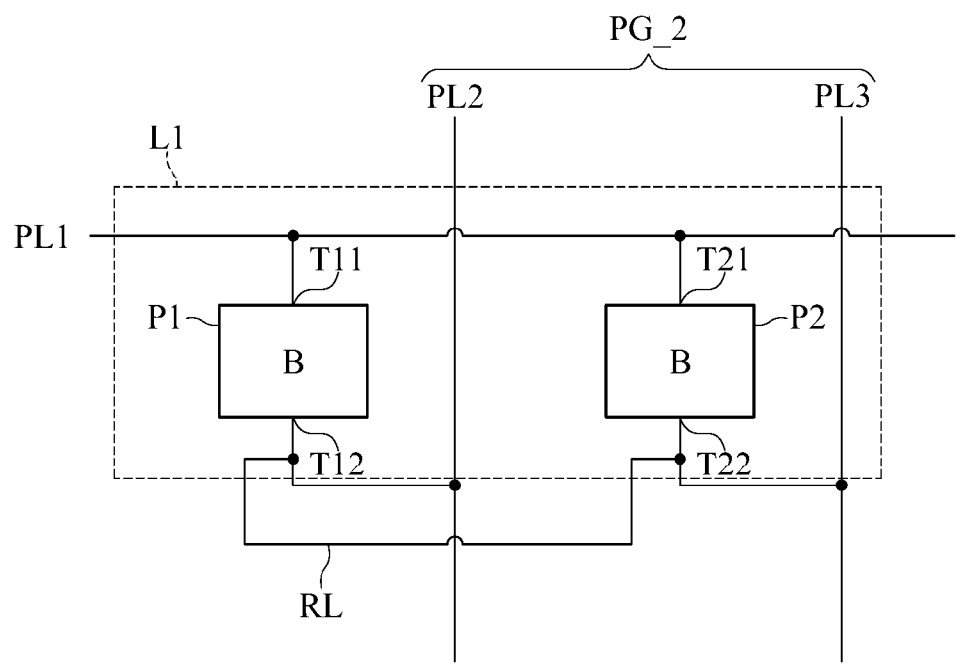
FIG. 3 is a circuit architecture diagram of a part of a first pixel repairing block according to another embodiment of the present invention.

In an embodiment, the first pixel repairing block PRG_1 further has a first lens L1. In an embodiment, the first lens L1 covers the repairing line RL, as shown in FIG. 2. In another embodiment, referring to FIG. 3, FIG. 3 is a circuit architecture diagram of a part of a first pixel repairing block according to another embodiment of the present invention. In this embodiment, the first pixel repairing block PRG_1 includes the first lens L1, covering the first sub-pixel unit P1 and the second sub-pixel unit P2. A difference from the embodiment in FIG. 2 lies in that, in the embodiment in FIG. 3, the first lens L1 does not cover the repairing line RL or does not completely cover the repairing line RL. Compared with the embodiment in FIG. 2, an advantage of the embodiment in FIG. 3 is: When the repairing line RL is not welded completely or the repairing line RL has a defect due to another reason, the lens does not need to be removed, and the repairing line RL can be reset directly. In another example, the first pixel repairing block PRG_1 includes a second lens L2 and a third lens L3. The second lens L2 covers the first sub-pixel unit P1, and the third lens L3 covers the second sub-pixel unit P2.

Figure 4:
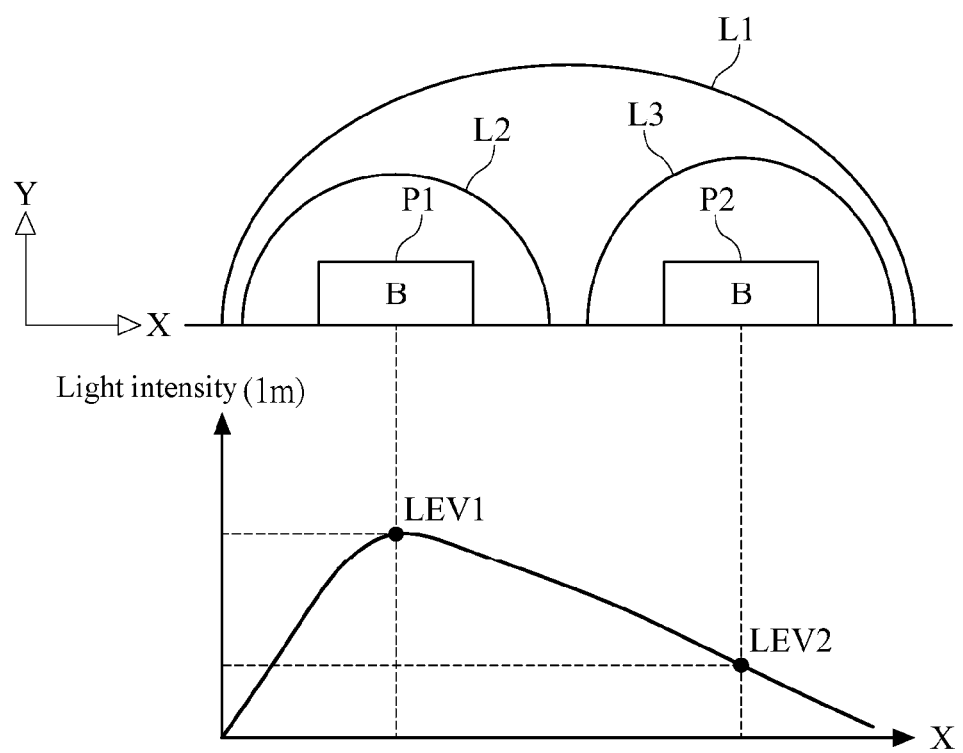
FIG. 4 is a side view of a part of a first pixel repairing block and a schematic diagram of light patterns thereof according to an embodiment of the present invention.

In another example, referring to FIG. 4, FIG. 4 is a side view of a part of a first pixel repairing block and a schematic diagram of light patterns thereof according to an embodiment of the present invention. As shown in FIG. 4, the first pixel repairing block PRG_1 includes the first lens L1, the second lens L2, and the third lens L3. When the second sub-pixel unit P2 cannot be operated to emit light, the first sub-pixel unit P1 may be used together with the lens, to implement an optical compensation function, and a light pattern and a light intensity after the compensation are shown in FIG. 4. In FIG. 4, a light intensity LEV1 is generated by the first sub-pixel unit P1 that can be operated normally. A light intensity LEV2 is a light intensity that is generated after the first sub-pixel unit P1 that can be operated normally makes an optical compensation for the second sub-pixel unit P2. As can be known from FIG. 4, although the light intensity LEV2 obtained after the optical compensation cannot be completely consistent with the light intensity LEV1, the light intensity LEV2 can reach a half of the light intensity LEV1. Therefore, even if the second sub-pixel unit P2 cannot be operated, little impact is caused visually. In the display device in the embodiments of the present invention, an objective of connecting the first sub-pixel unit P1 and the second sub-pixel unit P2 by using the repairing line RL is to make an optical compensation by using the first sub-pixel unit P1 and the second sub-pixel unit P2 that are adjacent and that are of a same color. For example, when the LED in the second sub-pixel unit P2 is damaged and the LED in the first sub-pixel unit P1 can be operated normally, a drive signal that originally tends to flow through the damaged second sub-pixel unit P2 is conducted by using the repairing line RL to the first sub-pixel unit P1 that is operated normally, and the first lens L1 is set, so that the LED in the first sub-pixel unit P1 can make an optical compensation for the LED in the second sub-pixel unit P2.

Figure 5:
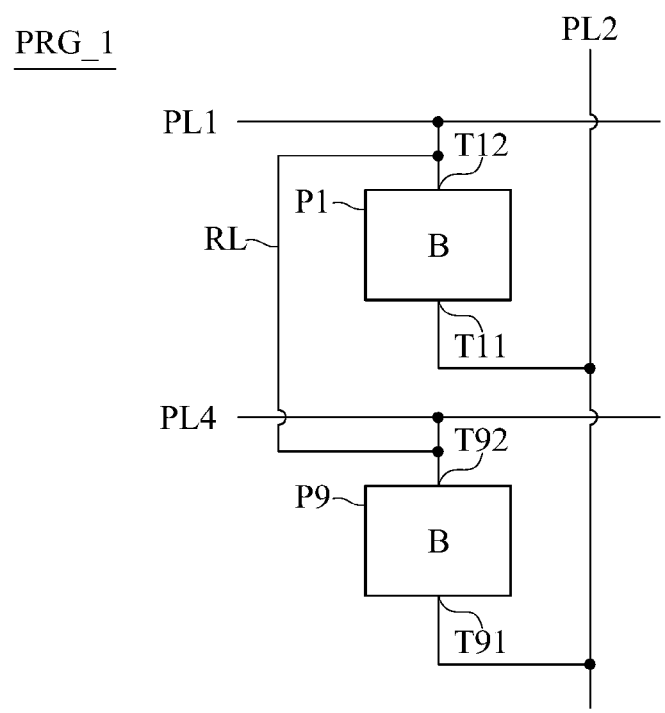
FIG. 5 is a circuit architecture diagram of a part of a first pixel repairing block according to another embodiment of the present invention.

In another embodiment, referring to FIG. 5, FIG. 5 is a circuit architecture diagram of a part of a first pixel repairing block according to another embodiment of the present invention. As shown in FIG. 5, the first sub-pixel unit P1 has the first power supply terminal T11 and the second power supply terminal T12. The first power supply terminal T11 of the first sub-pixel unit P1 is electrically coupled to the first power line PL2, and the second power supply terminal T12 of the first sub-pixel unit P1 is electrically coupled to the second power line PL1. Specifically, the cathode terminal of the LED in the first sub-pixel unit P1 is electrically coupled to the first power line PL2, and the anode terminal of the LED in the first sub-pixel unit P1 is electrically coupled to the second power line PL1. In practice, a current flows from the second power line PL1 to the anode terminal of the LED, and flows out from the cathode terminal of the LED to the first power line PL2, so that the LED emits light. A ninth sub-pixel unit P9 has a first power supply terminal T91 and a second power supply terminal T92. The first power supply terminal T91 of the ninth sub-pixel unit P9 is electrically coupled to the first power line PL2, and the second power supply terminal T92 of the ninth sub-pixel unit P9 is electrically coupled to the third power line PL4. Specifically, a cathode terminal of an LED in the ninth sub-pixel unit P9 is electrically coupled to the first power line PL2, and an anode terminal of the LED in the ninth sub-pixel unit P9 is electrically coupled to the third power line PL4. In practice, a current flows from the third power line PL4 to the anode terminal of the LED, and flows out from the cathode terminal of the LED to the first power line PL2, so that the LED emits light. In this embodiment, the second power supply terminal T12 of the first sub-pixel unit P1 is electrically coupled to the second power supply terminal T92 of the ninth sub-pixel unit P9 by using the repairing line RL. When the first sub-pixel unit P1 is damaged and cannot be operated, a drive signal that originally tends to flow through the damaged first sub-pixel unit P1 is conducted by using the repairing line RL to the ninth sub-pixel unit P9 that can be operated normally, so that the ninth sub-pixel unit P9 makes an optical compensation for the first sub-pixel unit P1. In the foregoing embodiment, the sub-pixel units that are adjacent in a left-right direction make an optical compensation for each other, while in the embodiment in FIG. 5, the first sub-pixel unit P1 and the ninth sub-pixel unit P9 that are adjacent in an up-down direction make an optical compensation for each other.

Figure 6:
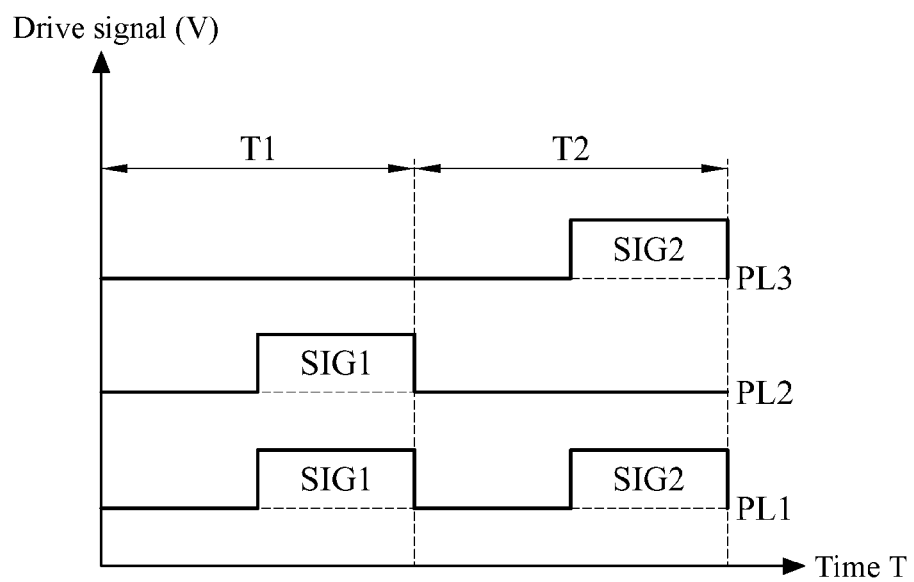
FIG. 6 is an operation sequence diagram of a drive signal according to an embodiment of the present invention.

A specific example is used to describe how adjacent sub-pixel units make an optical compensation. Referring to FIG. 2 and FIG. 6, FIG. 6 is an operation sequence diagram of a drive signal according to an embodiment of the present invention. In the example in FIG. 6, it is assumed that the LED in the first sub-pixel unit P1 can be operated normally and the LED in the second sub-pixel unit P2 is damaged. As shown in FIG. 6, in a first period T1, the first power supply terminal T11 of the first sub-pixel unit P1 of the first pixel repairing block PRG_1 outputs a first driving signal SIG1, coming from the first power line PL1, to the first sub-pixel unit P1 of the first pixel repairing block PRG_1. In practice, the first driving signal SIG1 is used to drive the first sub-pixel unit P1 to generate luminance. After the first sub-pixel unit P1 of the first pixel repairing block PRG_1 receives the first driving signal SIG1, the first driving signal SIG1 may be further output from the second power supply terminal T12 of the first sub-pixel unit P1 to the second power line PL2. In this case, the first sub-pixel unit P1 may generate corresponding luminance according to the first driving signal SIG1.

In a second period T2 adjacent to the first period T1, the first power supply terminal T11 of the first sub-pixel unit P1 of the first pixel repairing block PRG_1 outputs a second driving signal SIG2, coming from the first power line PL1, to the first sub-pixel unit P1 of the first pixel repairing block PRG_1. The second driving signal SIG2 is further output from the second power supply terminal T12 of the first sub-pixel unit P1 to the third power line PL3 by using the repairing line RL. The second driving signal SIG2 originally is provided to the LED in the damaged second sub-pixel unit P2. The second driving signal SIG2 may be conducted by using the repairing line RL included in the first pixel repairing block PRG_1 in the present invention to the first sub-pixel unit P1 that can be operated normally, so that the LED in the first sub-pixel unit P1 generates corresponding luminance according to the second driving signal SIG2. In this way, when the second sub-pixel unit P2 is damaged, corresponding luminance may still be generated by using the adjacent first sub-pixel unit P1 in the second period T2, to achieve an optical compensation effect. The second power supply terminal T12 of the first sub-pixel unit P1 is electrically coupled to the third power line PL3, so that a same drive time sequence (used to drive the damaged first pixel repairing block PRG_1) may be used to drive the repaired first pixel repairing block PRG_1.

Figure 7:
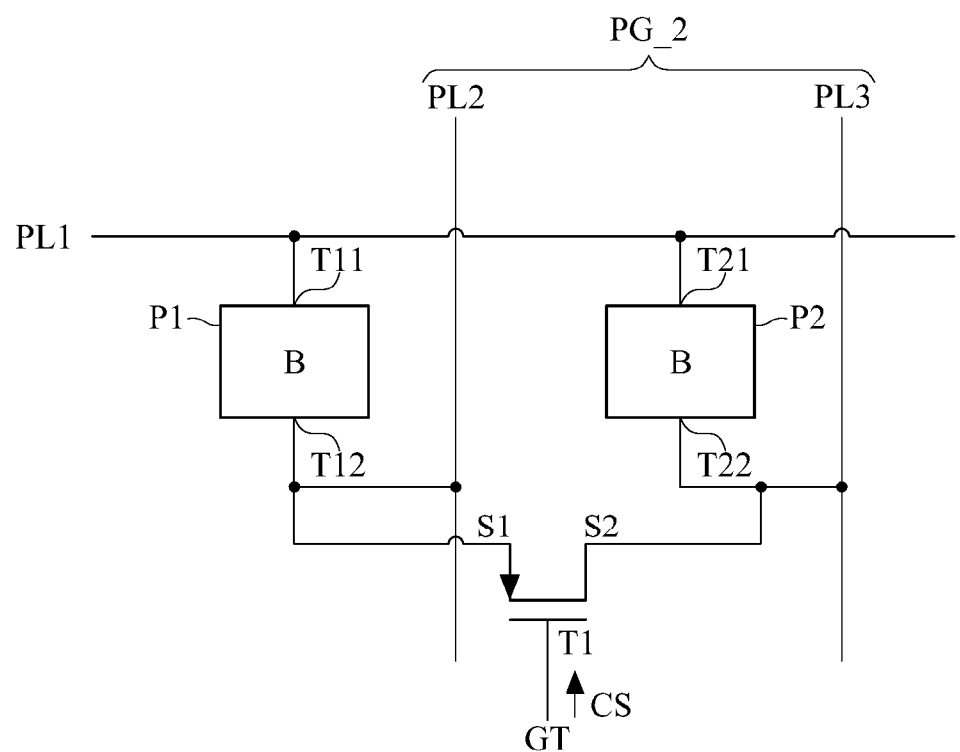
FIG. 7 is a circuit architecture diagram of a part of a first pixel repairing block according to another embodiment of the present invention.

Referring to FIG. 7, FIG. 7 is a circuit architecture diagram of a part of a first pixel repairing block according to another embodiment of the present invention. Compared with the foregoing embodiment, in this embodiment, the first pixel repairing block PRG_1 includes a transistor T1, and the first sub-pixel unit P1 is electrically coupled to the second sub-pixel unit P2 by using the transistor T1. The transistor T1 includes a control terminal GT, a first terminal S1, and a second terminal S2. The control terminal GT of the transistor T1 is controlled by a control signal CS. The first terminal S1 of the transistor T1 is electrically coupled to the second power supply terminal T12 of the first sub-pixel unit P1, and the second terminal S2 of the transistor T1 is electrically coupled to the second power supply terminal T22 of the second sub-pixel unit P2. In this embodiment, it is still assumed that the LED in the first sub-pixel unit P1 can be operated normally and the LED in the second sub-pixel unit P2 is damaged. The transistor T1 conducts the second power supply terminal T12 of the first sub-pixel unit P1 and the second power supply terminal T22 of the second sub-pixel unit P2 according to the control signal CS, to achieve an optical compensation effect.

Figure 8:
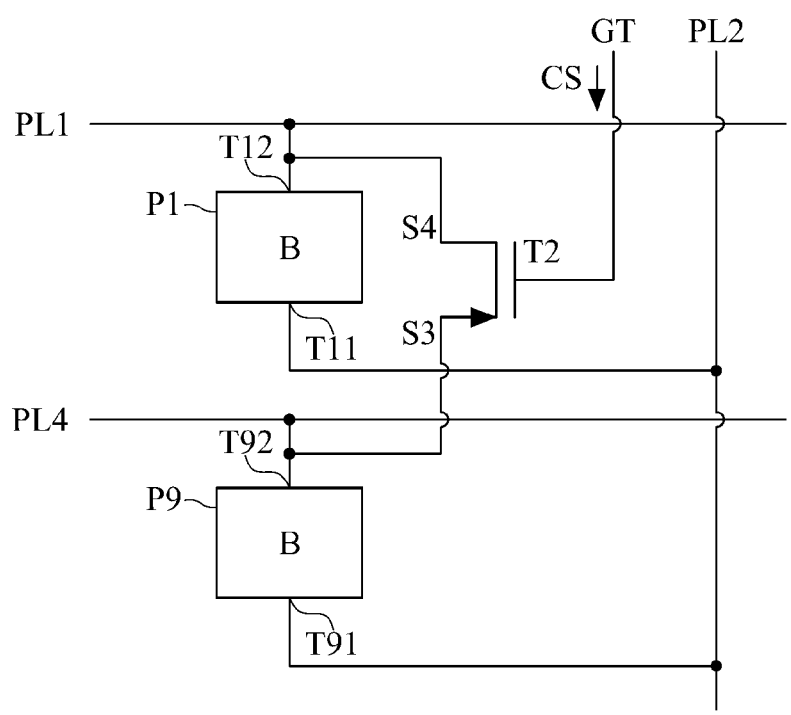
FIG. 8 is a circuit architecture diagram of a first pixel repairing block according to another embodiment of the present invention.

In the embodiment in FIG. 7, the first sub-pixel unit P1 and the second sub-pixel unit P2 that are adjacent in a left-right direction are electrically coupled by using the transistor T1. Referring to FIG. 8, FIG. 8 is a circuit architecture diagram of a first pixel repairing block according to another embodiment of the present invention. Compared with FIG. 7, the first pixel repairing block in FIG. 8 includes a transistor T2, and the first sub-pixel unit P1 and the ninth sub-pixel unit P9 that are adjacent in an up-down direction are electrically coupled by using the second transistor T2. As shown in FIG. 8, the transistor T2 has a control terminal GT, a first terminal S3 and a second terminal S4. The control terminal GT of the transistor T2 is controlled by a control signal CS. The first terminal S3 of the transistor T2 is electrically coupled to the second power supply terminal T92 of the ninth sub-pixel unit P9, and the second terminal S4 of the transistor T2 is electrically coupled to the second power supply terminal T12 of the first sub-pixel unit P1. In this embodiment, it is still assumed that the LED in the first sub-pixel unit P1 can be operated normally and the LED in the ninth sub-pixel unit P9 is damaged. The transistor T1 conducts the second power supply terminal T12 of the first sub-pixel unit P1 and the second power supply terminal T92 of the ninth sub-pixel unit P9 according to the control signal CS, to achieve the optical compensation effect.

Figure 9:
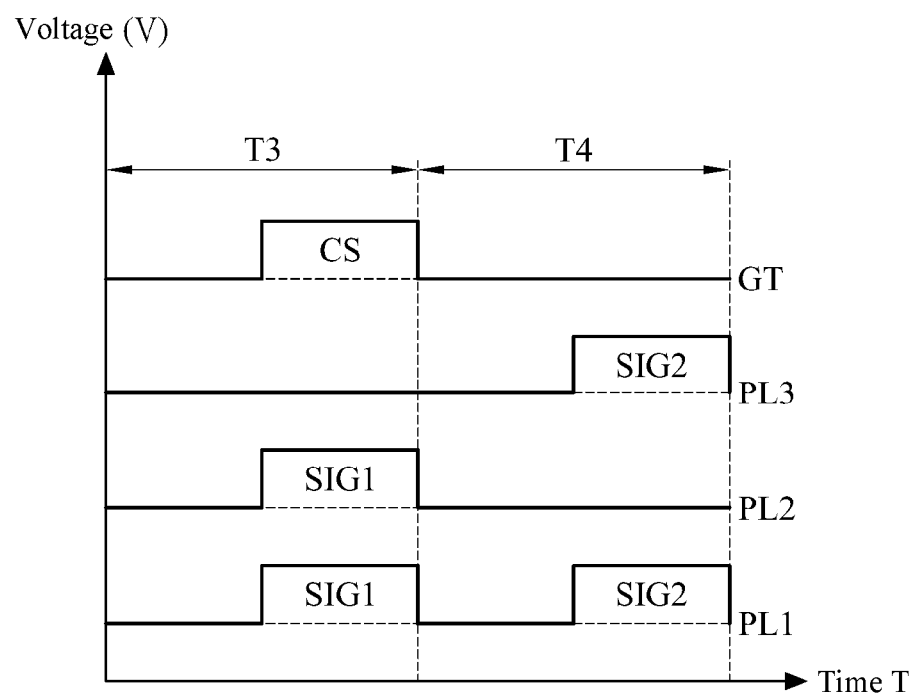
FIG. 9 is a sequence control diagram of a transistor and a drive signal according to another embodiment of the present invention.

Specifically, referring to FIG. 7 and FIG. 9, FIG. 9 is a sequence control diagram of a transistor and a drive signal according to another embodiment of the present invention. The transistor T1 is in a non-conducted state in a period T3. That is, as shown in FIG. 7, when the first sub-pixel unit P1 of the first pixel repairing block PRG_1 receives a first driving signal SIG1 in the third period T3, and may generate a corresponding first colored light (that is, blue light), the transistor T1 receives a high-level control signal CS, and is in the non-conducted state. When the second sub-pixel unit P2 does not generate the first colored light (that is, blue light) in a fourth period T4 adjacent to the third period T3, a control signal CS received by the transistor T1 in the fourth period T4 is a low-level control signal, so that the transistor T1 is in a conducted state. Therefore, the second driving signal SIG2 that originally tends to flow through the second sub-pixel unit P2 may be conducted by using the conducted transistor T1 to the first sub-pixel unit P1 that can be operated normally, so that the LED in the first sub-pixel unit P1 may make an optical compensation. In the embodiment in FIG. 6, each pixel repairing block (the first pixel repairing block PRG_1 to the fourth pixel repairing block PRG_4) is provided with the transistor T1, when a sub-pixel unit in one pixel repairing block cannot be operated normally, the transistor T1 in the pixel repairing block is conducted according to the control signal CS, to make an optical compensation. In the foregoing embodiment in FIG. 2, only after it is discovered that one pixel unit in a pixel repairing block cannot be operated normally, the repairing line RL is set, to make an optical compensation. In this embodiment, the transistor T1 is a P-type metal-oxide-semiconductor field-effect transistor. However, the present invention is not limited thereto. In another embodiment, the transistor T1 may be an N-type metal-oxide-semiconductor field-effect transistor, and a control signal CS changes correspondingly. A person of ordinary skill in the art may understand the spirit according to the foregoing embodiments, and understand how to adjust a control signal corresponding to the N-type metal-oxide-semiconductor field-effect transistor.

Figure 10A:
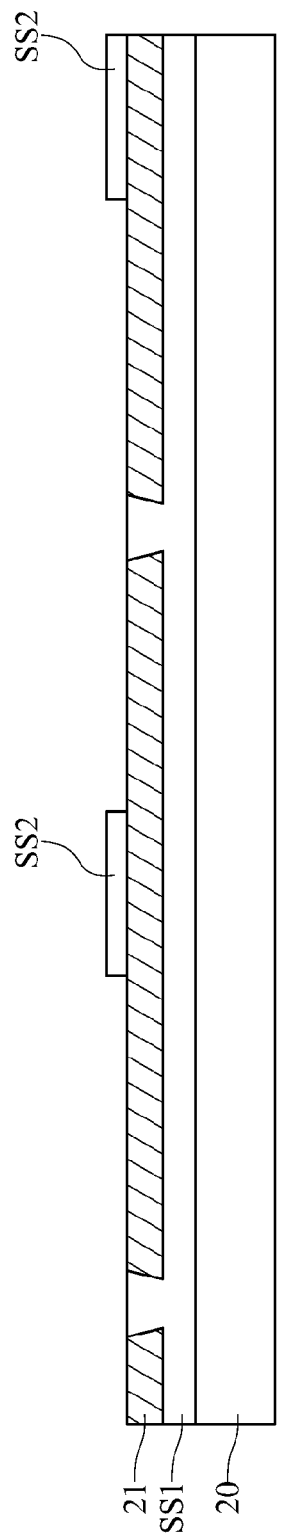
FIG. 10A to FIG. 10E are schematic cross-sectional diagrams of steps of a manufacturing process of a part of a first pixel repairing block according to an embodiment of the present invention.
Figure 10B:
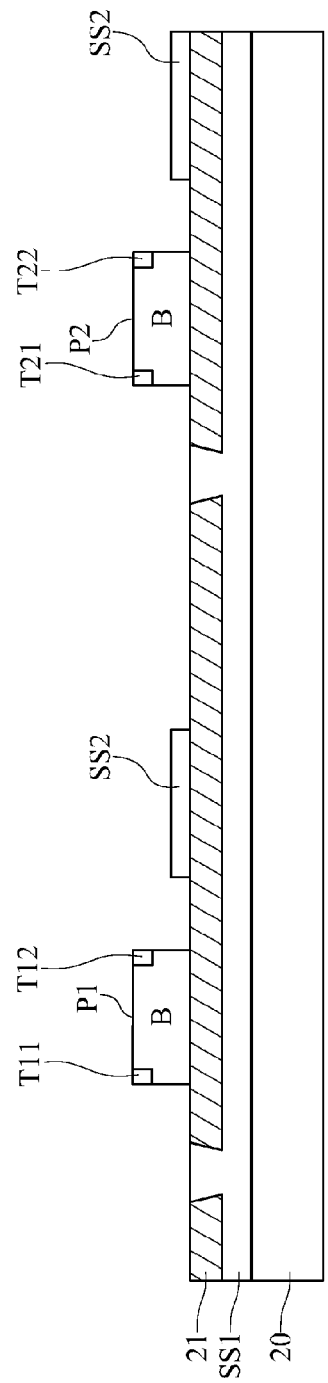
Figure 10C:
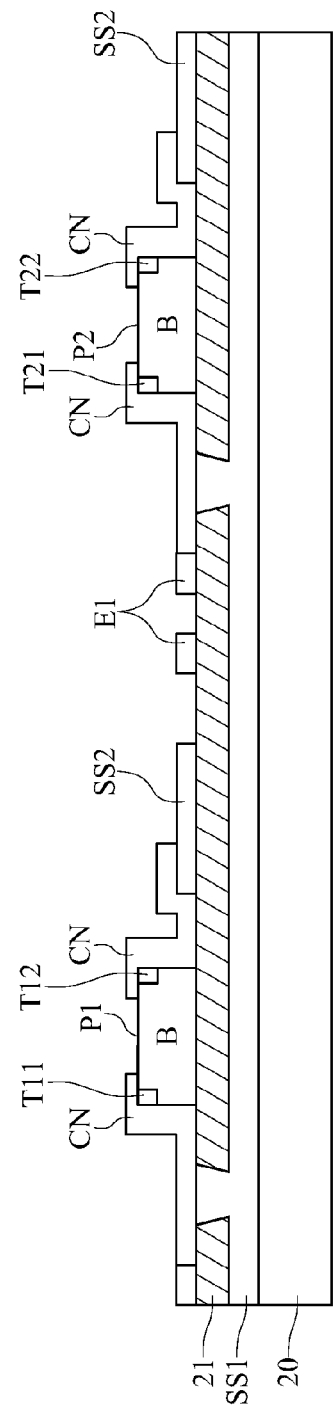
Figure 10D:
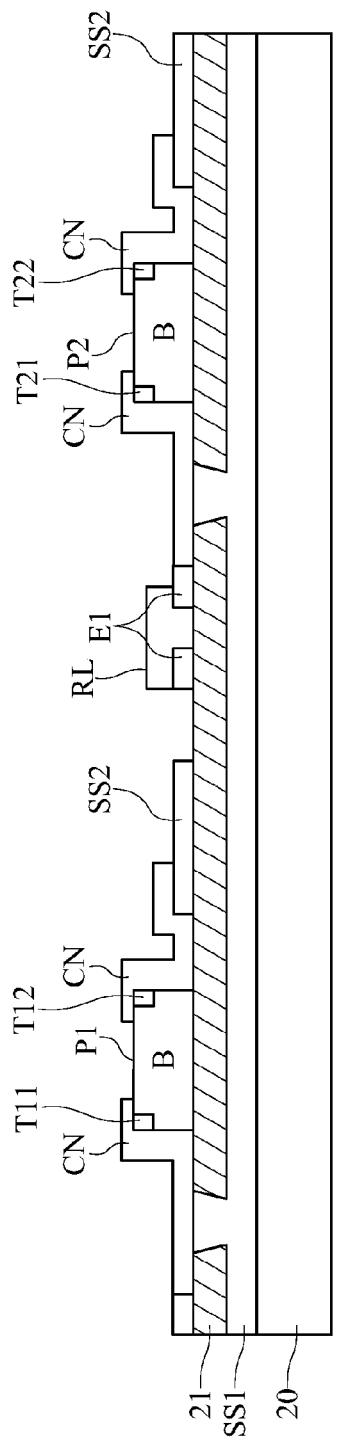
Figure 10E:
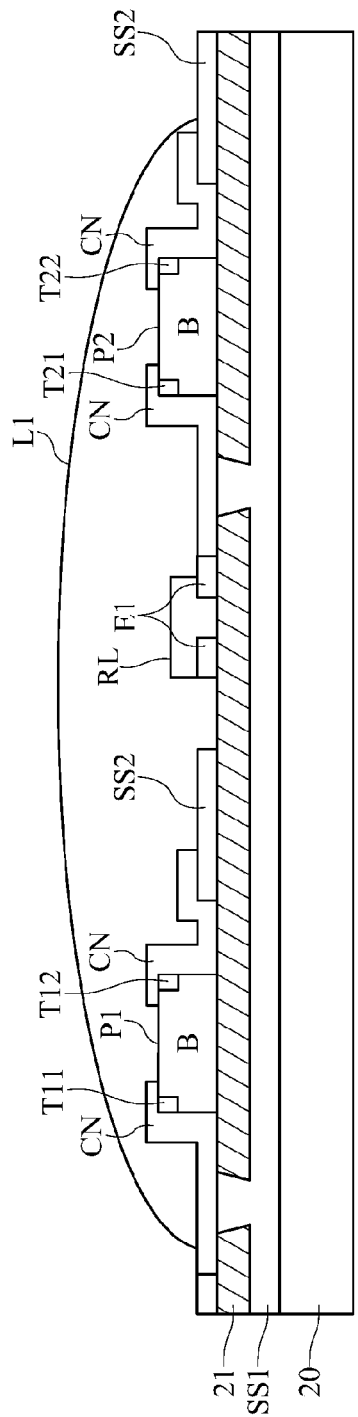
Figure 11:
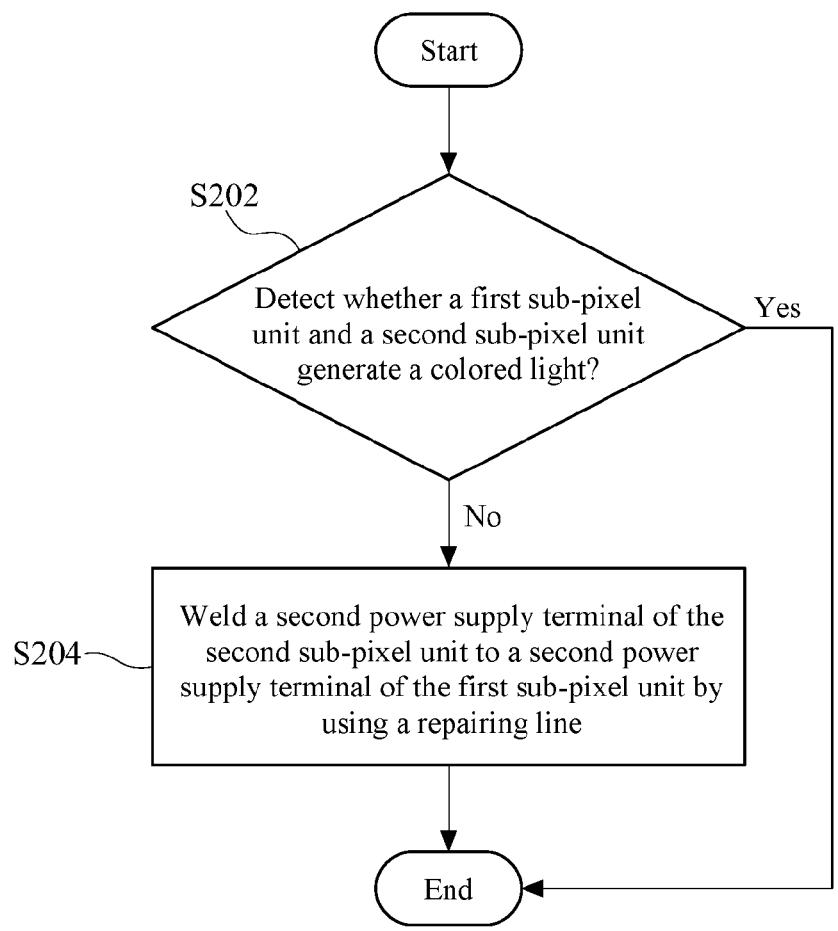
FIG. 11 is a flowchart of a pixel repairing method according to an embodiment of the present invention.

Referring to FIG. 10A to 10E and FIG. 11, FIG. 10A to 10E are schematic cross-sectional diagrams of steps of a manufacturing process of a part of a first pixel repairing block according to an embodiment of the present invention, and FIG. 11 is a flowchart of a pixel repairing method according to an embodiment of the present invention. The pixel repairing method is applied to the part of the first pixel repairing block PRG_1 in FIG. 10A to FIG. 10E. In the manufacturing process of the part of the first pixel repairing block PRG_1, first, as shown in FIG. 10A, the part of the first pixel repairing block PRG_1 has a drive backplane 20. A first signal layer SS1 and an insulation layer 21 are disposed above the drive backplane 20, and the first signal layer SS1 corresponds to the first power line group PG_1. Second signal layers SS2 are disposed above the insulation layer 21, and the second signal layers SS2 correspond to the second power line group PG_2. The insulation layer 21 may be used to isolate the first signal layer SS1 and the second signal layers SS2, to avoid that a mistake occurs in a signal transmission process. Then, as shown in FIG. 10B, the first sub-pixel unit P1 and the second sub-pixel unit P2 are disposed above the insulation layer 21. In the figure, the first sub-pixel unit P1 and the second sub-pixel unit P2 both have LEDs, where B represents blue light. The first sub-pixel unit P1 has the first power supply terminal T11 and the second power supply terminal T12, and the second sub-pixel unit P2 has the first power supply terminal T21 and the second power supply terminal T22. When the first sub-pixel unit P1 and the second sub-pixel unit P2 are set completely, as shown in FIG. 10C, the first sub-pixel unit P1 and the second sub-pixel unit P2 are electrically coupled to the first signal layer SS1 and the second signal layers SS2 by using conductors CN. In this case, the process of the pixel repairing method in FIG. 10 may be performed.

As shown in FIG. 11, in step S202, under a circuit architecture of FIG. 10C, it is detected whether the first sub-pixel unit P1 and the second sub-pixel unit P2 generate the first colored light (that is, blue light) respectively. Specifically, detection signals are transmitted to some LEDs in the first sub-pixel unit P1 and the second sub-pixel unit P2 by means of the electrical coupling between the first signal layer SS1, the second signal layers SS2, the first power supply terminal T11 and the second power supply terminal T12 of the first sub-pixel unit P1, and the first power supply terminal T21 and the second power supply terminal T22 of the second sub-pixel unit P2 to perform electrical detection, to further know whether the first sub-pixel unit P1 and the second sub-pixel unit P2 can be operated normally to generate the first colored light. If a detection result is that the first sub-pixel unit and the second sub-pixel unit P2 both can generate the first colored light, it indicates that the first sub-pixel unit P1 and the second sub-pixel unit P2 both can be operated normally, and the process of the repairing method is ended. If the detection result is that the first sub-pixel unit P1 can generate the first colored light, but the second sub-pixel unit P2 cannot generate the first colored light, it indicates that the LED in the first sub-pixel unit P1 can be operated normally, while the LED in the second sub-pixel unit P2 cannot be operated normally or is damaged. In this case, step S204 is performed. The second power supply terminal T22 of the second sub-pixel unit P2 is welded to the second power supply terminal T12 of the first sub-pixel unit P1 by using the repairing line RL, as shown in FIG. 10D. For example, two ends of the repairing line of a metal material may be respectively connected to the second power supply terminal T12 of the first sub-pixel unit P1 and the second power supply terminal T22 of the second sub-pixel unit P2 in a heating manner (for example, a laser or an electron beam). In an actual operation, the repairing line is welded to an electrode E1, to further connect the first sub-pixel unit P1 to the second sub-pixel unit P2. After the repairing line RL is welded, the first pixel repairing block PRG_1 is covered by using the first lens L1, as shown in FIG. 10E.

Figure 12A:
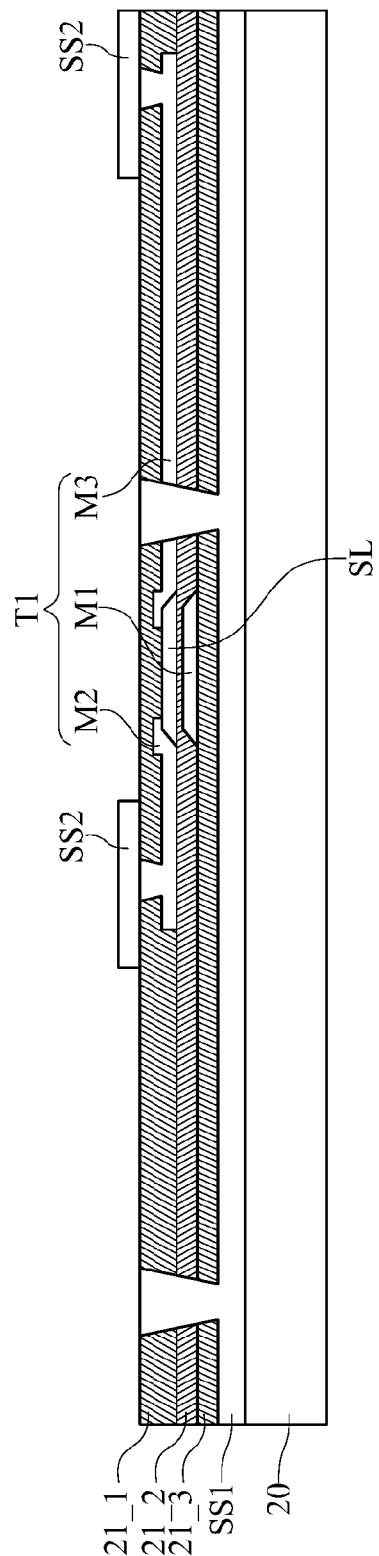
FIG. 12A to FIG. 12D are schematic cross-sectional diagrams of steps of a manufacturing process of a part of a first pixel repairing block according to another embodiment of the present invention.
Figure 12B:
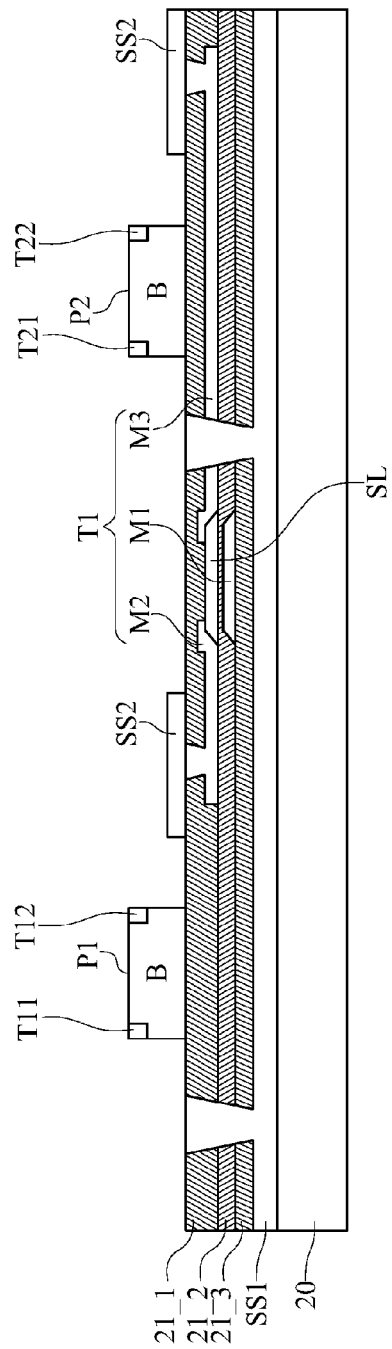
Figure 12C:
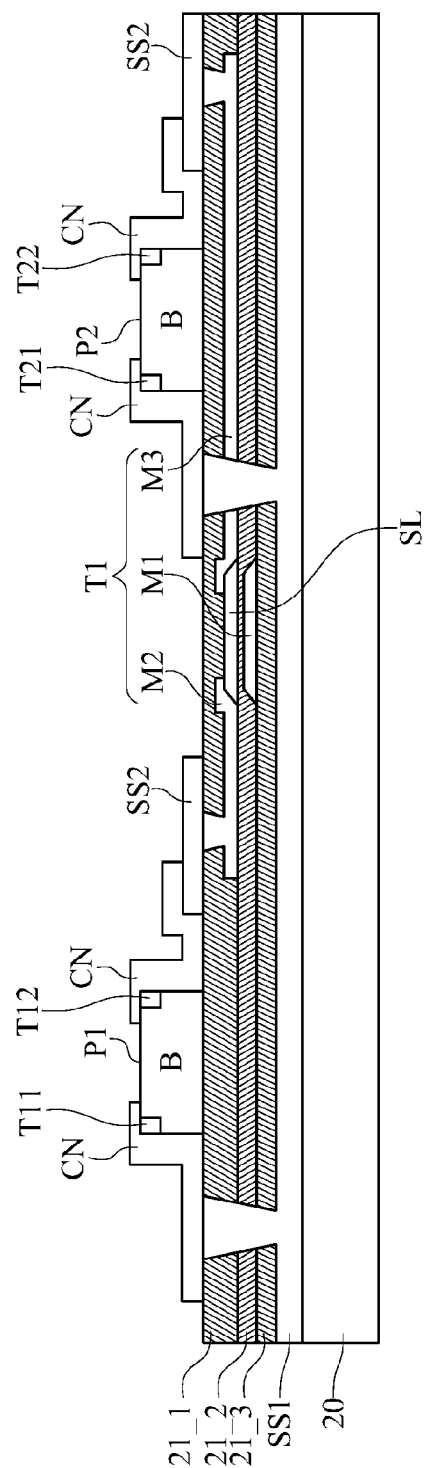
Figure 12D:
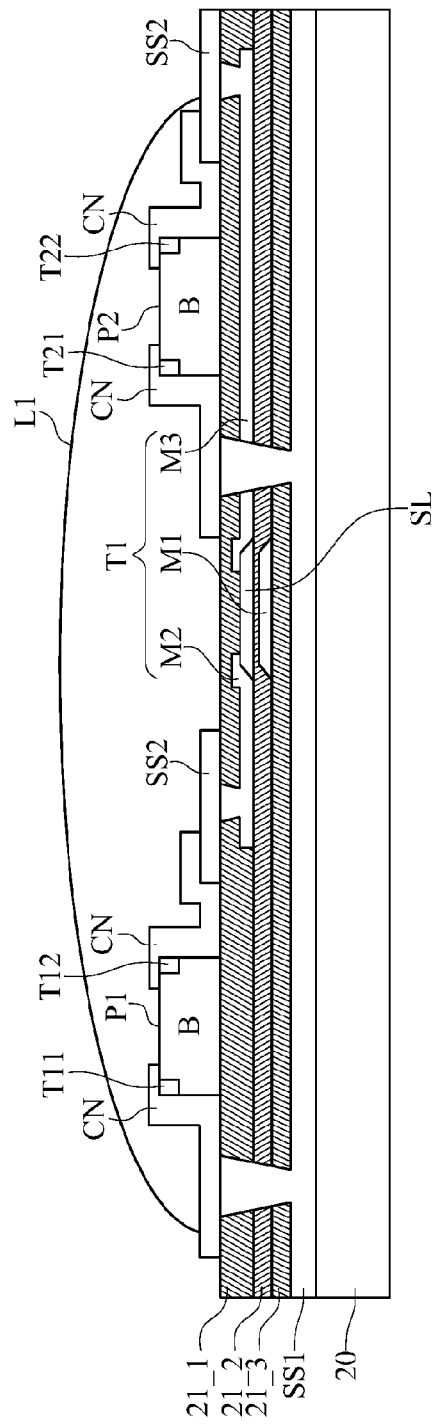

Referring to FIG. 12A to 12D, FIG. 12A to 12D are schematic cross-sectional diagrams of steps of a manufacturing process of a part of a first pixel repairing block according to another embodiment of the present invention. Compared with that pixel repairing is performed by using a repairing line RL in FIG. 8A to 8E, in FIG. 12A to 12D, a transistor T1 is used as a switch to achieve a repairing effect. First, as shown in FIG. 12A, the part of the first pixel repairing block PRG_1 has a drive backplane 20, and a first signal layer SS1 and insulation layers 21_1 to 21_3 are disposed above the drive backplane. Second signal layers SS2 are disposed above the insulation layer 21_1. The transistor T1 has a first metal M1, a second metal M2, a third metal M3, and a semi-conductor layer SL. In practice, the first metal M1 corresponds to a gate terminal, the second metal M2 corresponds to a source terminal, and the third metal M3 corresponds to a drain terminal. As shown in FIG. 12A, the first metal M1, the second metal M2, the third metal M3, and the semi-conductor layer SL are sandwiched between the insulation layers 21_1 to 21_3. The second metal M2 and the third metal M3 are separately electrically coupled to the second signal layers SS2. In FIG. 12B, the first sub-pixel unit P1 and the second sub-pixel unit P2 are disposed above the insulation layer 21_1. In the figure, the first sub-pixel unit P1 and the second sub-pixel unit P2 both have LEDs, where B represents blue light. The first sub-pixel unit P1 has the first power supply terminal T11 and the second power supply terminal T12, and the second sub-pixel unit P2 has the first power supply terminal T21 and the second power supply terminal T22. After two pixel units are set completely, in FIG. 12C, the first power supply terminal T11 and the second power supply terminal T12 of the first sub-pixel unit P1 and the first power supply terminal T21 and the second power supply terminal T22 of the second sub-pixel unit P2 are separately electrically coupled to the first signal layer SS1 and the second signal layers SS2 by using the conductors CN. After the process in FIG. 12C is completed, it may be tested whether the first sub-pixel unit P1 and the second sub-pixel unit P2 can generate the first colored light. If a test result is that the first sub-pixel unit P1 can generate the first colored light, but the second sub-pixel unit P2 cannot generate the first colored light, in FIG. 12C, the first pixel repairing block PRG_1 is covered by using the first lens L1.

In an embodiment, the pixel repairing method in FIG. 11 further includes: covering both the first sub-pixel unit P1 and the second sub-pixel unit P2 by using the first lens L1. In an actual manufacturing process, a coating manner may be used, a light transmissible material is used as the first lens L1 and is coated above the first sub-pixel unit P1 and the second sub-pixel unit P2. In an embodiment, after the second power supply terminal T22 of the second sub-pixel unit P2 is welded to the second power supply terminal T12 of the first sub-pixel unit P1 by using the repairing line RL, the first sub-pixel unit P1 and the second sub-pixel unit P2 are covered by using the first lens L1. In another embodiment, before the second power supply terminal T22 of the second sub-pixel unit P2 is welded to the second power supply terminal T12 of the first sub-pixel unit P1 by using the repairing line RL, the first sub-pixel unit P1 and the second sub-pixel unit P2 are covered by using the first lens L1. The foregoing multiple embodiments describe only sub-pixel units that are adjacent in a left-right direction and that are of a same color. However, a person skilled in the art may know from the foregoing multiple embodiments that sub-pixel units that are adjacent in an up-down direction and that are of a same color may also achieve an optical compensation effect by using the foregoing implementation manners and principles.

Figure 13:
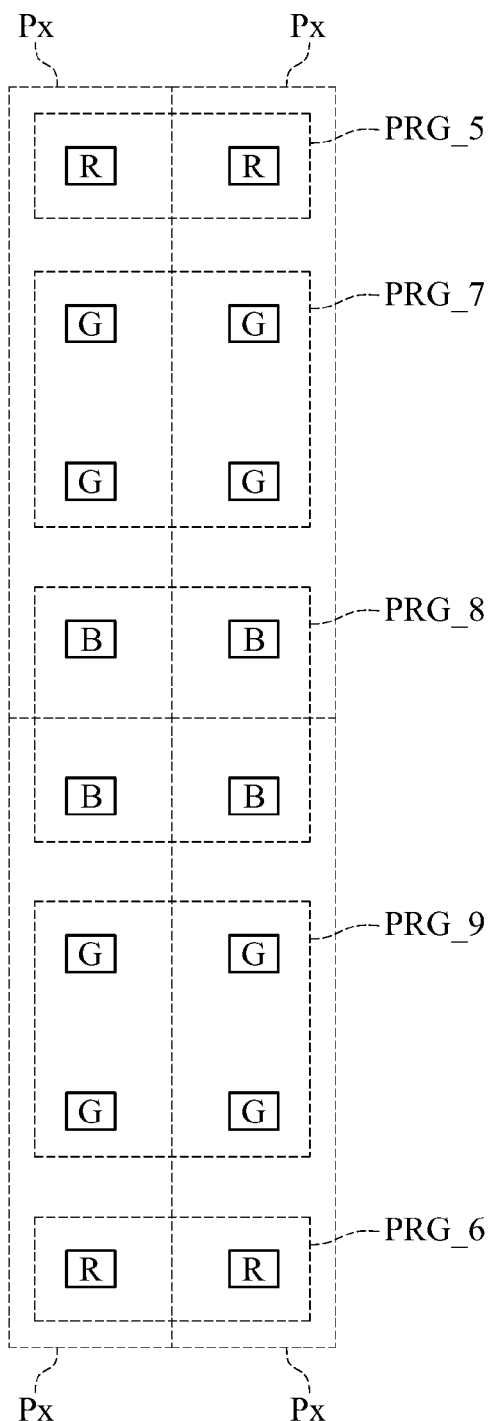
FIG. 13 is a schematic top view of a display device according to an embodiment of the present invention.
Figure 14:
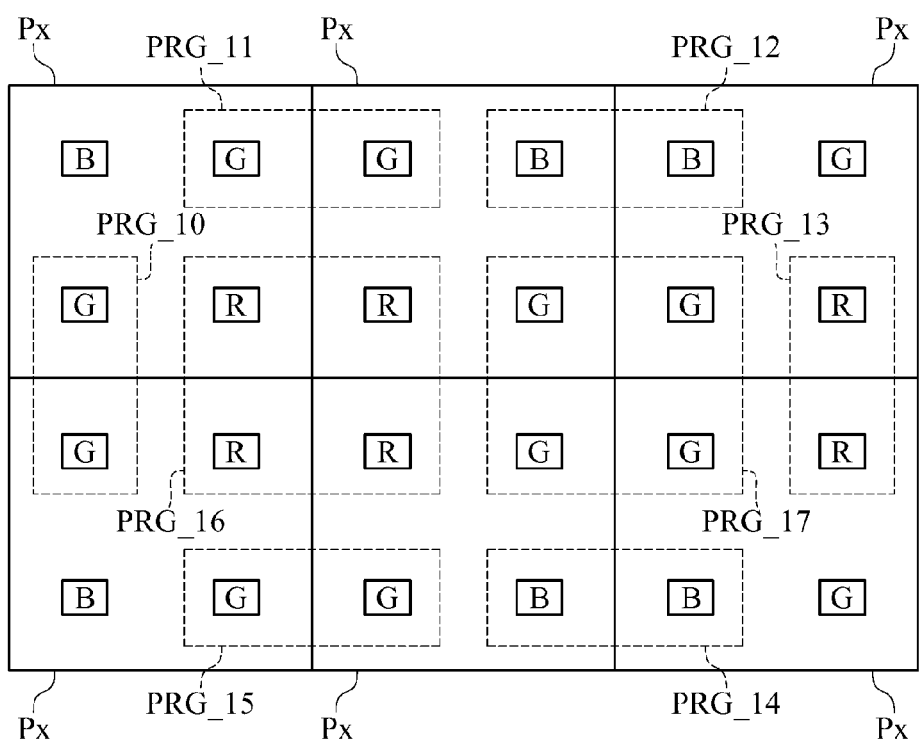
FIG. 14 is a schematic top view of a display device according to another embodiment of the present invention.

For example, referring to FIG. 13 and FIG. 14, FIG. 13 is a schematic top view of a display device according to an embodiment of the present invention, and FIG. 14 is a schematic top view of a display device according to another embodiment of the present invention. As shown in FIG. 13, each pixel Px is formed by arranging R, G, G, B perpendicularly. Under this structure, in addition to that some sub-pixel units of a fifth pixel repairing block PRG_5 and a sixth pixel repairing block PRG_6 may make an optical compensation in a left-right direction, some sub-pixel units of a seventh pixel repairing block PRG_7, an eighth pixel repairing block PRG_8, and a ninth pixel repairing block PRG_9 may further make an optical compensation in both a left-right direction and an up-down direction. As shown in FIG. 14, each pixel Px is formed by arranging R, G, G, B in a form of a square. Similarly, under this structure, some sub-pixel units of a tenth pixel repairing block PRG_10 and a thirteenth pixel repairing block PRG_13 may make an optical compensation in an up-down direction, some sub-pixel units of an eleventh pixel repairing block PRG_11, a twelfth pixel repairing block PRG_12, a fourteenth pixel repairing block PRG_14, and a fifteenth pixel repairing block PRG_15 may make an optical compensation in a left-right direction, and some sub-pixel units of a sixteenth pixel repairing block PRG_16 and a seventeenth pixel repairing block PRG_17 may make an optical compensation in both a left-right direction and an up-down direction. In the embodiments in FIG. 13 and FIG. 14, the implementation manners of the display device are merely exemplary descriptions, and the present invention is not limited thereto. As long as adjacent sub-pixel units of a same color are used for optical compensation, it falls within the protection scope of the present invention.

In conclusion, in the certain display device in the embodiments of the present invention, a plurality of adjacent sub-pixel units of a same color forms a sub pixel repairing block. When one sub-pixel unit is damaged, an adjacent sub-pixel unit of the same color is electrically coupled to the damaged sub-pixel unit, to conduct a driving signal that originally tends to flows to the damaged the sub-pixel unit to the adjacent sub-pixel unit of the same color, and a lens is set, thereby achieving an optical compensation effect.

Although the present invention is disclosed above by using the foregoing embodiments, the foregoing embodiments are not used to limit the present invention. Any modification and improvement made within the spirit and scope of the present invention shall fall within the patent protection scope of the present invention. For the protection scope of the present invention, refer to the appended patent application scope.

What is claimed is:

1. A display device, comprising:
   a first power line group comprising a first power line;
   a second power line group comprising a second power line;
   a third power line;
   a plurality of pixel repairing blocks, wherein each of the plurality of pixel repairing blocks comprises:
   a first sub-pixel unit, having a first power supply terminal and a second power supply terminal, wherein the first power supply terminal of the first sub-pixel unit is electrically coupled to the first power line, the second power supply terminal of the first sub-pixel unit is electrically coupled to the second power line, and the first sub-pixel unit generates a first light of a first color; and
   a second sub-pixel unit, having a first power supply terminal and a second power supply terminal, wherein the first power supply terminal of the second sub-pixel unit is electrically coupled to the first power line, the second power supply terminal of the second sub-pixel unit is electrically coupled to the third power line, and the second sub-pixel unit generates a second light of the first color;

wherein the second power supply terminal of the first sub-pixel unit of a first pixel repairing block among the pixel repairing blocks is electrically coupled to the second power supply terminal of the second sub-pixel unit of the first pixel repairing block.

2. The display device according to claim 1, wherein the first pixel repairing block further comprises a repairing line, separately connected to the second power supply terminal of the second sub-pixel unit and the second power supply terminal of the first sub-pixel unit.

3. The display device according to claim 2, wherein the first pixel repairing block further comprises:
   a first lens, covering the first sub-pixel unit and the second sub-pixel unit.

4. The display device according to claim 3, wherein the repairing line is not covered by the first lens.

5. The display device according to claim 1, wherein each of the plurality of pixel repairing blocks further comprises:
   a transistor, having a control terminal, a first terminal, and a second terminal, wherein the control terminal of the transistor is controlled by a control signal, the first terminal of the transistor is electrically coupled to the second power supply terminal of the first sub-pixel unit, and the second terminal of the transistor is electrically coupled to the second power supply terminal of the second sub-pixel unit.

6. The display device according to claim 5, wherein the transistor is in a non-conducted state in a first period, the first sub-pixel unit of the first pixel repairing block generates the first light of the first color in the first period, and when the second sub-pixel unit does not generate the second light of the first color in a second period, and the transistor is in a conducted state in the second period, where the second period is adjacent to the first period.

7. The display device according to claim 1, wherein:
   in a third period, the first power supply terminal of the first sub-pixel unit of the first pixel repairing block outputs a first driving signal, coming from the first power line, to the first sub-pixel unit of the first pixel repairing block, and the first driving signal is output from the second power supply terminal of the first sub-pixel unit of the first pixel repairing block to the second power line;
   in a fourth period, the first power supply terminal of the first sub-pixel unit of the first pixel repairing block outputs a second driving signal, coming from the first power line, to the first sub-pixel unit of the first pixel repairing block, and the second driving signal is output from the second power supply terminal of the first sub-pixel unit of the first pixel repairing block to the third power line; and
   the fourth period is adjacent to the third period.

8. The display device according to claim 1, wherein the first pixel repairing block further comprises:
   a second lens, covering the first sub-pixel unit; and
   a third lens, covering the second sub-pixel unit.

9. A pixel repairing method, applied to a pixel repairing block, wherein the pixel repairing block comprises a first sub-pixel unit and a second sub-pixel unit, to generate a first light of a first color, the first sub-pixel unit has a first power supply terminal and a second power supply terminal, and the second sub-pixel unit has a first power supply terminal and a second power supply terminal and is adjacent to the first sub-pixel unit; the pixel repairing method comprises:
   detecting whether the first sub-pixel unit and the second sub-pixel unit generate the first light of the first color and a second light of the first color respectively; and
   welding the second power supply terminal of the second sub-pixel unit to the second power supply terminal of the first sub-pixel unit by using a repairing line when the first sub-pixel unit generates the first light of the first color and the second sub-pixel unit fails generating the second light of the first color.

10. The pixel repairing method according to claim 9, further comprising:
    covering the first sub-pixel unit and the second sub-pixel unit by a first lens.

11. The pixel repairing method according to claim 10, wherein covering the first sub-pixel unit and the second sub-pixel unit by the first lens is performed before welding the second power supply terminal of the second sub-pixel unit to the second power supply terminal of the first sub-pixel unit by using the repairing line.

* * * * *